(12) United States Patent
Lan et al.

(10) Patent No.: US 8,553,142 B2
(45) Date of Patent: Oct. 8, 2013

(54) CAMERA LENS MODULE AND MANUFACTURING METHOD THEREOF

(75) Inventors: Wei-Hao Lan, Taipei (TW);
Chih-Hsiung Su, Sijhih (TW);
Wei-Ting Chang, Taipei (TW);
Chien-Chung Chen, Taipei (TW)

(73) Assignees: Lite-On Electronics (Guangzhou) Limited, Guangzhou (CN); Lite-On Technology Corporation, Taipei (TW)

( * ) Notice: Subject to any disclaimer, the term of this patent is extended or adjusted under 35 U.S.C. 154(b) by 469 days.

(21) Appl. No.: 12/494,936

(22) Filed: Jun. 30, 2009

(65) Prior Publication Data

US 2010/0110282 A1    May 6, 2010

(30) Foreign Application Priority Data

Oct. 30, 2008   (CN) .......................... 2008 1 0218861

(51) Int. Cl.
*H04N 5/225* (2006.01)
(52) U.S. Cl.
USPC .......................................... 348/374; 348/373
(58) Field of Classification Search
USPC .................... 348/86, 374; 396/419
See application file for complete search history.

(56) References Cited

U.S. PATENT DOCUMENTS

| 5,219,217 | A | * | 6/1993 | Aikens | 362/560 |
|---|---|---|---|---|---|
| 5,389,788 | A | * | 2/1995 | Grinberg et al. | 250/331 |
| 6,507,083 | B1 | * | 1/2003 | Tian | 257/432 |
| 2001/0050721 | A1 | * | 12/2001 | Miyake | 348/374 |
| 2005/0134721 | A1 | * | 6/2005 | Ito | 348/363 |
| 2005/0139946 | A1 | * | 6/2005 | Hung et al. | 257/433 |
| 2007/0007668 | A1 | * | 1/2007 | Brandenburg et al. | 257/783 |
| 2007/0165136 | A1 | * | 7/2007 | Wu et al. | 348/373 |
| 2008/0252775 | A1 | * | 10/2008 | Ryu et al. | 348/374 |
| 2009/0021624 | A1 | * | 1/2009 | Westerweck et al. | 348/308 |
| 2009/0052887 | A1 | * | 2/2009 | Cheng et al. | 396/529 |

FOREIGN PATENT DOCUMENTS

| CN | 2725916 Y |   | 9/2005 |
| JP | 08156324 | * | 6/1996 |

* cited by examiner

*Primary Examiner* — Roberto Velez
*Assistant Examiner* — Stephen Coleman
(74) *Attorney, Agent, or Firm* — Li & Cai Intellectual Property (USA) Office

(57) ABSTRACT

The present invention discloses a camera lens module. The present invention places and fixes an image sensor chip in an opening in a substrate and then assembles a frame, a lens holder and a lens, thereby minimizing the superposition height of the camera lens module and ensuring that the assembly is simpler and more effective.

8 Claims, 9 Drawing Sheets

CAMERA LENS MODULE AND MANUFACTURING METHOD THEREOF

BACKGROUND OF THE INVENTION

1. Field of the Invention

The present invention relates to a camera lens module and manufacturing method thereof, and more particularly to an optical camera lens module which has the least assembled spatial height and manufacturing method thereof.

2. Description of Related Art

Conventional camera lens modules and manufacturing methods thereof generally dispose an image sensor chip onto a substrate, then bond wires, deposit adhesive and mount a camera lens. Please refer to FIG. 1 illustrating an improved camera lens module structure disclosed in Chinese Patent No. CN2725916Y. The assembly method for camera lens module S first places an image sensor chip 4 on a substrate 1, then electrically connects the image sensor chip 4 to the substrate 1 via metal wires 41, and finally mounts a lens holder 5 and a lens 6, whereby the total height H of the assembled camera lens module S is the height from the top of the lens holder 5 to the bottom of substrate 1 of the camera lens module. As shown in FIG. 1, the total height H is determined by the thickness h2 of the image sensor chip 4, the thickness h1 of the substrate 1 and the distance h3 between the top surface of the camera lens and the top surface of the image sensor chip. Accordingly, in the conventional method it is difficult to reduce the total height of the camera lens module. However, conventional products related to camera lens modules, such as mobile phones, PDAs, digital cameras and notebook computers and so on, become thinner and smaller. Hence, how to improve the structure of the camera lens module to provide an optimized camera lens module and manufacturing method thereof which can reduce the height of the camera lens module is the problem that the present invention proposes to solve.

SUMMARY OF THE INVENTION

An object of the present invention is to provide a camera lens module and manufacturing method thereof wherein the thickness h1 of the substrate has no effect on the total height of the assembled camera lens module which only depends on h2 and h3 so that the total height of the camera lens module is minimized.

To achieve the above-mentioned object, a camera lens module in accordance with the present invention is provided. The camera lens module includes a substrate having an opening and a plurality of input conductive portions disposed thereon adjacent to the opening; an image sensor chip which is smaller than the opening of the substrate, and embedded in the opening and electrically connected with the substrate by the plurality of input conductive portions on the substrate; a frame which is placed on the image sensor chip and fixed on the substrate; a lens holder fixed on the frame; and a lens which is assembled in the holder.

Advantageously, the substrate is a printed circuit board (PCB) or other substrate materials which can achieve circuit characteristic. A layer of opaque non-conductive material is attached to a bottom surface of the camera lens module and the opaque non-conductive material may be non-conductive thin film of black gum adhering to the bottom of the camera lens module or non-conductive black lacquer applied to the bottom of the camera lens module. Furthermore, the material may be omitted according to shading light and insulating conditions for products.

Advantageously, the image sensor chip is connected with the plurality of input conductive portions disposed on the substrate by a plurality of metal short wires. Adhesive is applied to the frame and the areas of the lens holder corresponding to the substrate and the image sensor chip and then the frame, the lens holder and the lens are mounted and fixed.

To further achieve the above-mentioned object, the present invention also provides a method of manufacturing a camera lens module. The method includes the steps of: fixing an image sensor chip in an opening of a substrate and applying a first adhesive deposit to fix one edge of the image sensor chip on one edge of the opening of the substrate via adhesion, and then performing a first adhesive drying process; bonding wires to electrically connect the image sensor chip with the substrate by a plurality of input conductive portions disposed on the substrate; performing a second adhesive deposit to deposit adhesive on the periphery of the image sensor chip without an optical function and on a predetermined periphery of the substrate near the opening of the substrate; fixing a frame on the corresponding positions where the second adhesive deposit is applied and performing a second adhesive drying process; applying a third adhesive deposit to deposit adhesive on recesses in the frame to fix the relative relationships between the substrate, the image sensor chip and the frame, and then performing a third adhesive drying process; and assembling a lens holder and a lens to mount the lens in the lens holder and applying a fourth adhesive deposit around the periphery of the frame to fix the lens holder assembled with the lens on the frame, and then performing a fourth adhesive drying process.

Before the first adhesive deposit, the substrate and the image sensor chip are fixed on an adhesive base so as to fix the relative position of the image sensor chip and the substrate. Before assembling the lens holder and the lens, take down the fixed image sensor chip and substrate from the adhesive base and apply an auxiliary adhesive deposit from a bottom surface of the substrate in a gap between the opening of the substrate and the image sensor chip to fill around the metal wires, and then perform an auxiliary adhesive drying process, thereby the adhesive surrounds the metal wires to form a protection. After assembly of the lens holder and the lens, apply a layer of opaque material to a bottom surface of the assembled camera lens module, that is, attach thin film of black gum to the bottom surface of the camera lens module or apply a layer of non-conductive black lacquer to the bottom surface of the camera lens module. The thin film of black gum or the black lacquer may be omitted according to product quality.

Advantageously, the substrate is a printed circuit board (PCB) or other substrate materials which can achieve circuit characteristic. The adhesive drying processes after the adhesive deposit steps may be achieved by drying or UV irradiation.

Comparing with conventional methods which directly fix image sensor chips on surfaces of substrates, the camera lens module and manufacturing method thereof of the present invention firstly embeds the image sensor chip in the opening of the substrate, and then use the adhesive and the frame to fix the substrate, the image sensor chip and the frame. The present invention fixes one edge of the image sensor chip with on edge of the opening of the substrate so that the wires can be bonded correctly and uses the adhesive and the frame to improve the structure strength of the camera lens module and eliminate the effects of the thickness of the substrate, thereby reducing the total height of the camera lens module.

It is important to note that the camera lens module of the embodiment can be applied in mobile phones, PDA and notebook computers which have optical camera lens modules, and digital cameras and so on, and the camera lens module manufacturing method can further be applied in manufacturing the camera lens modules used in the above products. The camera lens module and manufacturing method thereof is not limited in the above described products and manufacturing methods, and any product with a camera lens module can use the camera lens module and the camera lens module manufacturing method related the embodiment.

DETAILED DESCRIPTION OF THE PREFERRED EMBODIMENTS

These and other technical contents, features and efficacy of the present invention will become more readily appreciated when considered in connection with the following detailed description and appended drawings related two embodiments of the present invention.

Before describing the present invention in detail, it is to note that like numerals indicate like parts through the several views and the description.

Figure 1:
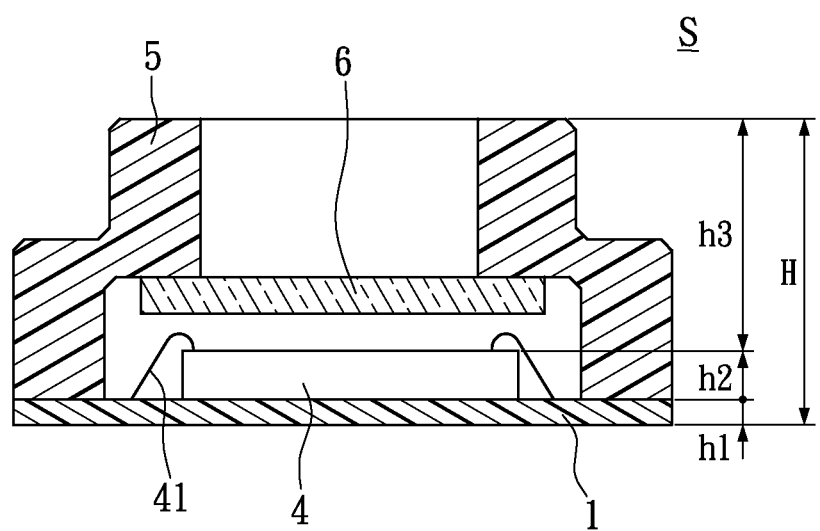
FIG. 1 is a structural schematic view of a conventional camera lens module.
Figure 2:
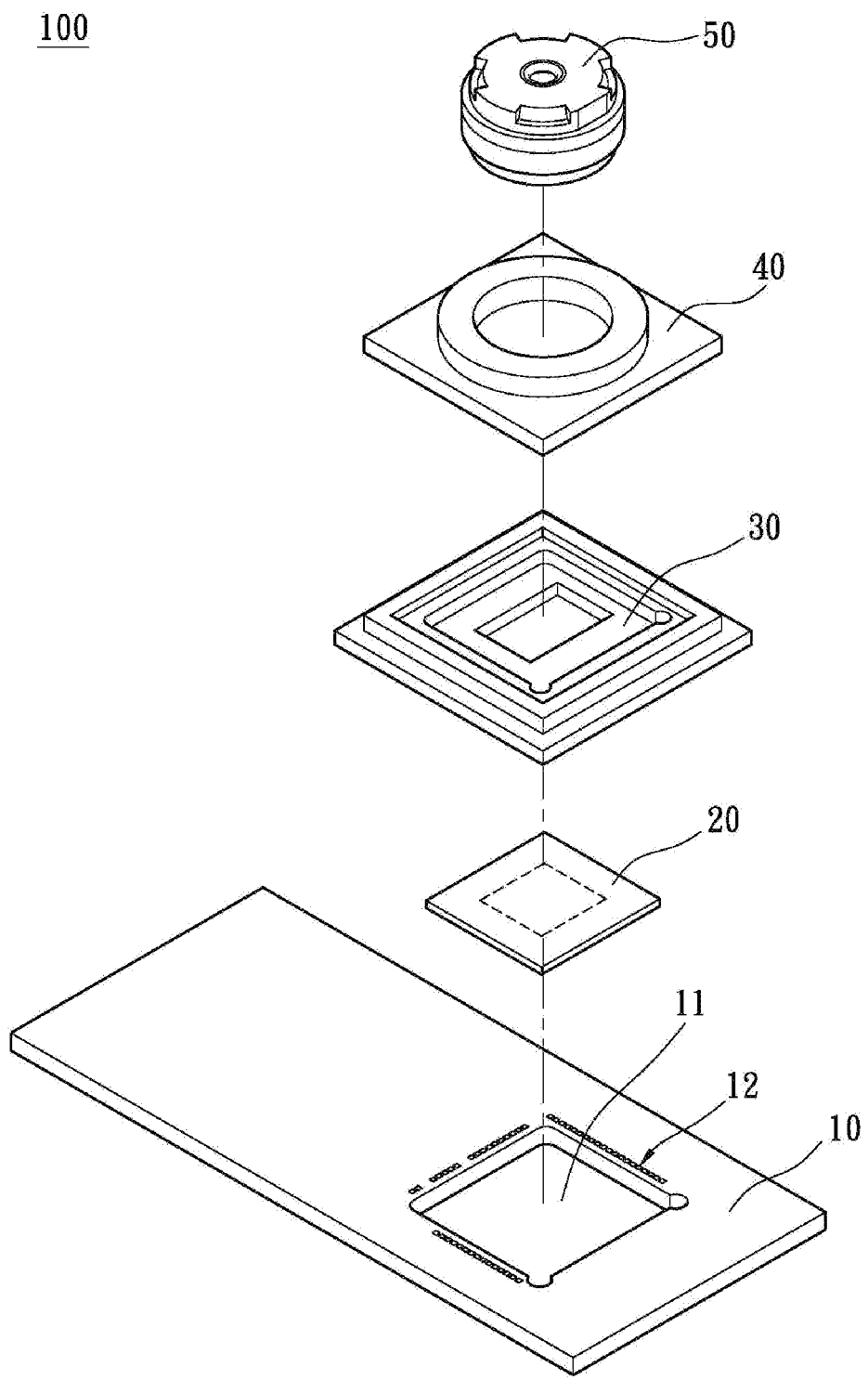
FIG. 2 is an exploded perspective view of a camera lens module of an embodiment of the present invention.

Please refer to FIG. 2, the embodiment provides a camera lens module 100 which includes a substrate 10, an image sensor chip 20, a frame 30, a lens holder 40 and a lens 50. There is an opening 11 in the substrate 10, and a plurality of input conductive portions 12 is disposed on the substrate 10, adjacent to the opening 11.

Figure 3:
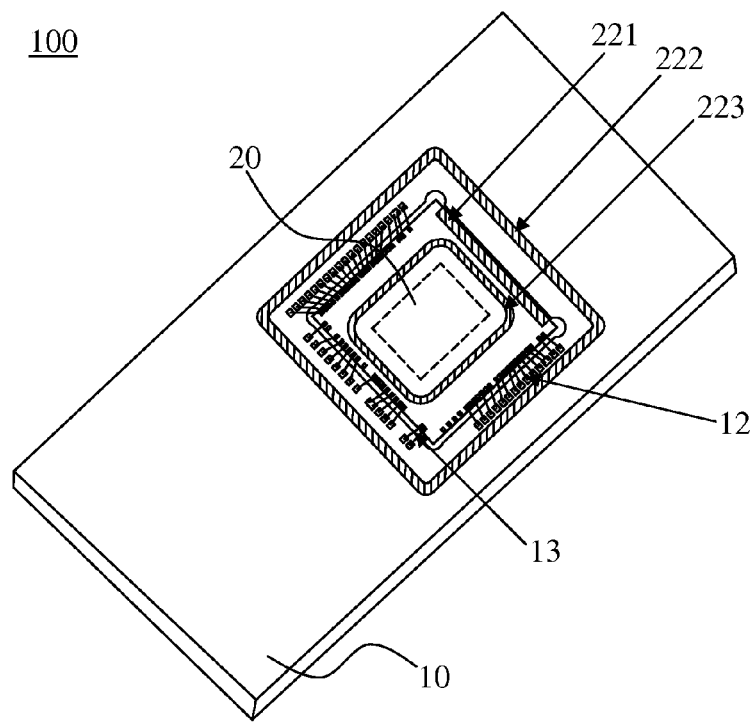
FIG. 3 is a first structural schematic view of the camera lens module of the embodiment of the present invention.

Please refer to FIG. 3, the image sensor chip 20 is disposed in the opening 11 of the substrate 10, and one edge of the image sensor chip 20 is fixed on the substrate 10 via adhesive 221 and the other three edges there of, which are not fixed via the adhesive 221, are connected with the a plurality of input conductive portions 12 disposed on the substrate 10 by a plurality of metal short wires 13. As shown in FIG. 3, adhesive 223 and adhesive 222 are respectively applied on the periphery of the image sensor chip 20 without an optical function and on a predetermined periphery of the substrate 10 near the opening 11 of the substrate 10

Figure 4:
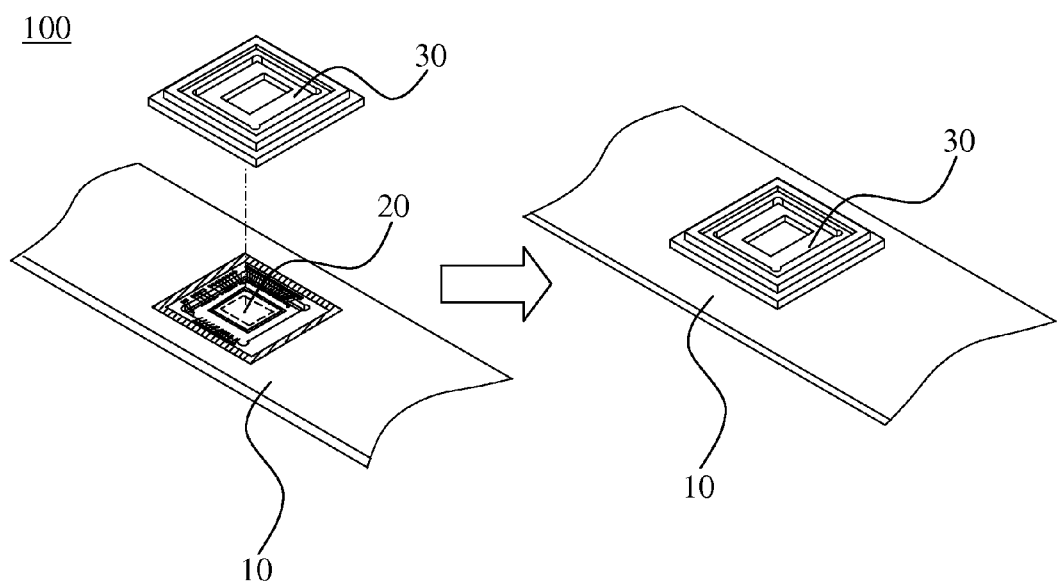
FIG. 4 is a second structural schematic view of the camera lens module of the embodiment of the present invention.

Refer to FIG. 4, corresponding to the positions of the adhesive 222 and the adhesive 223, the frame 30 is fixed above the image sensor chip 20 and the substrate 10.

Figure 5:
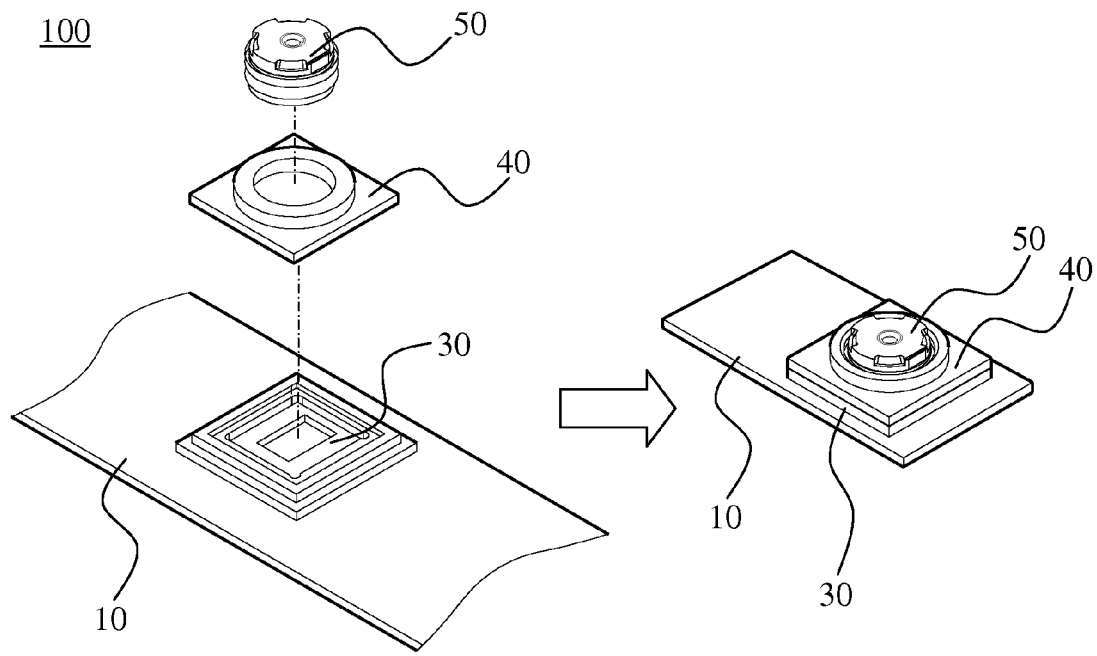
FIG. 5 is a third structural schematic view of the camera lens module of the embodiment of the present invention.

Please refer to FIG. 5, the lens 50 is assembled in the lens holder 40 and the lens holder 40 is fixed on the frame 30.

Figure 6:
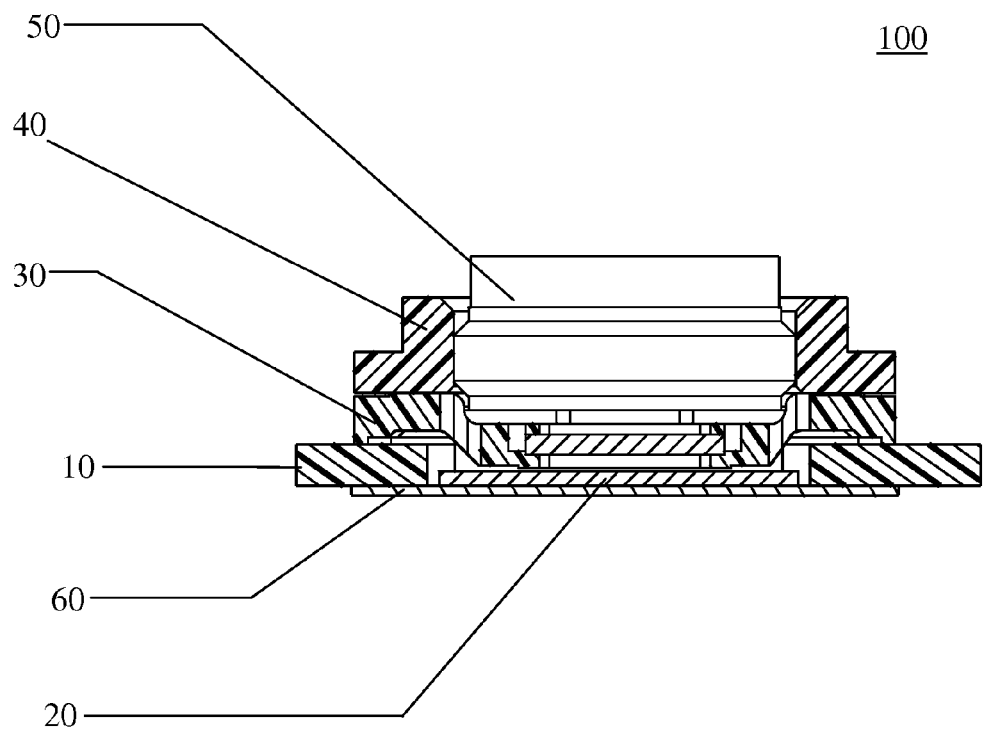
FIG. 6 is a cross-sectional view of the camera lens module of the embodiment of the present invention, wherein metal short wires are not shown.

Referring to FIG. 6, which is a cross-sectional view of the camera lens module 100 of the embodiment and the metal short wires 13 are not shown, a layer of opaque non-conductive material 60 is attached to a bottom surface of the camera lens module 100 and the layer of material may be thin film of black gum; alternatively black lacquer is coated on the bottom surface of the camera lens module 100. The thin film of black gum or the black lacquer may be omitted according to product application. In the embodiment, the image sensor chip 20 is disposed in the opening 11 of substrate 10, so the height of the substrate 10 has no effect on the superposition height of the image sensor chip 20 and the substrate 10, thereby the total height of the camera lens module 100 is reduced.

The embodiment also provides a camera lens module manufacturing method of which the steps will be described in detail in connection with the appended drawings.

Figure 7:
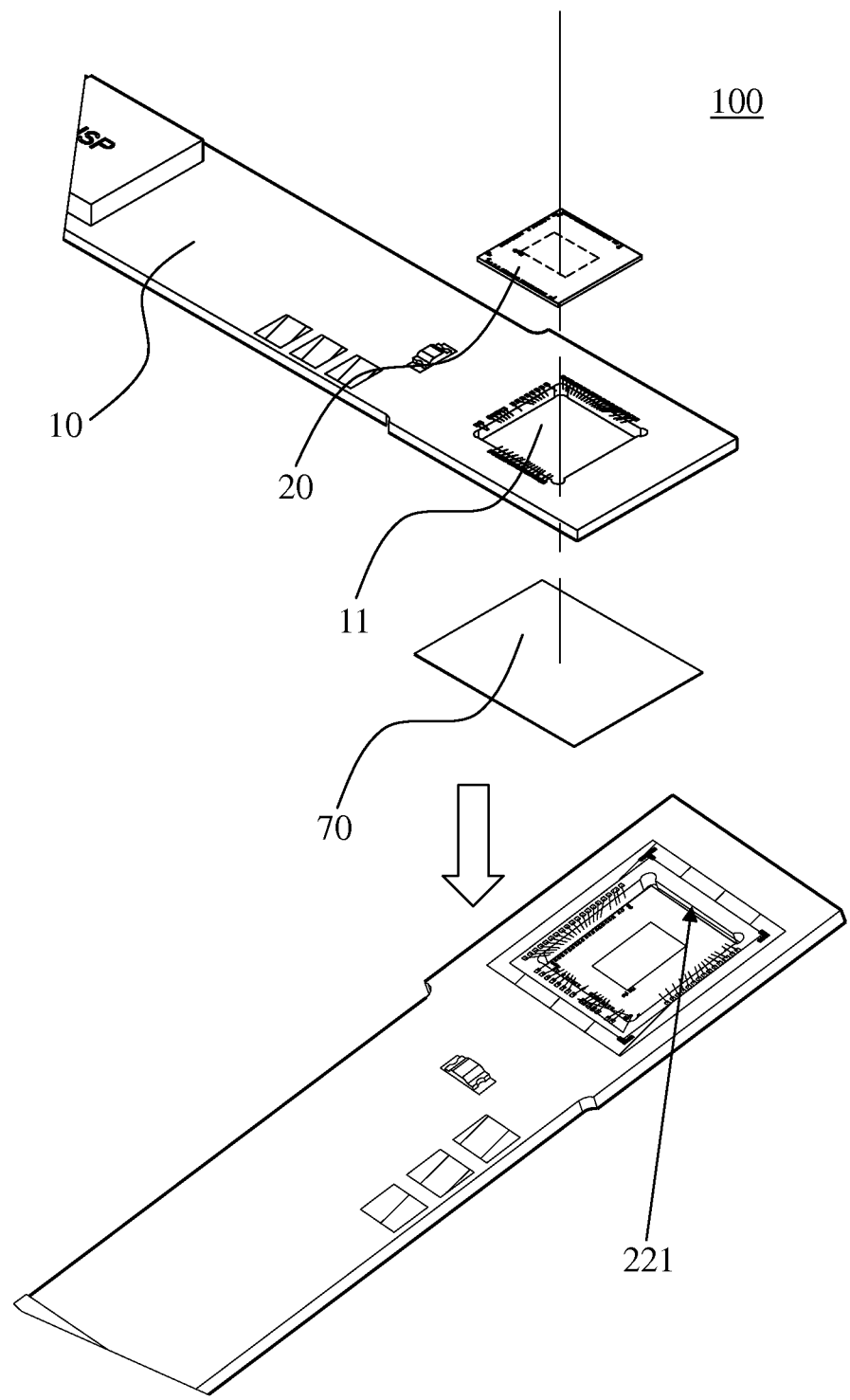
FIG. 7 is a first schematic view of a camera lens module manufacturing method of an embodiment of the present invention.

Step 1, referring to FIG. 7, correspondingly attach the opening 11 of the substrate 10 to a adhesive base 70, and then place the image sensor chip 20 in the opening 11 of the substrate 10. Since the adhesive base 70 is sticking, the adhesive base 70 is used for determining the relative position of the image sensor chip 20 and the substrate 10, and the image sensor chip 20 and the substrate 10 are fixed by the adhesive base 70. At this time, a first adhesive deposit is applied, wherein the adhesive 221 is deposited on the area pointed by the arrow head in FIG. 7 (i.e., one edge of the image sensor chip 20), so that the image sensor chip 20 and the substrate 10 are fixed via adhesion. And then a first adhesive drying process is performed.

Figure 8:
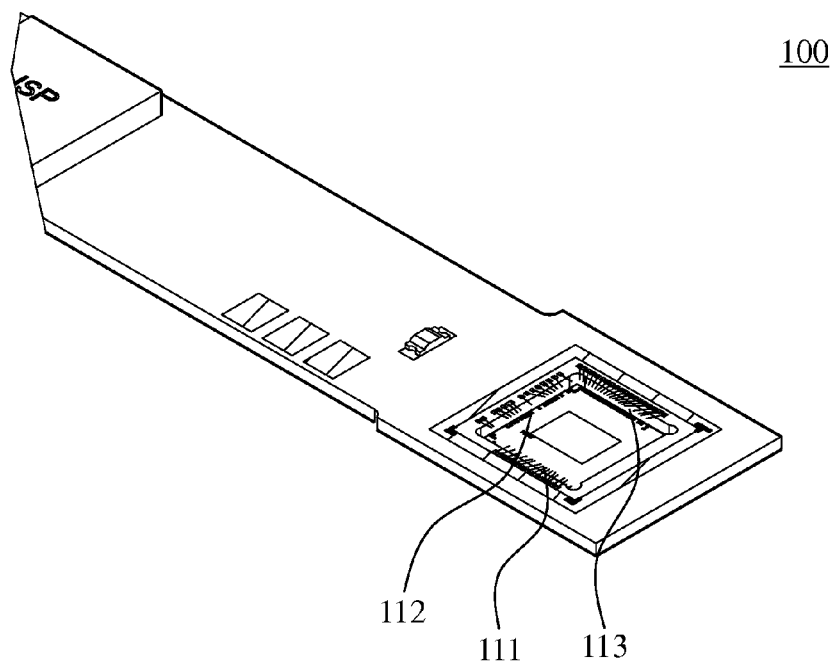
FIG. 8 is a second schematic view of the camera lens module manufacturing method of the embodiment of the present invention.

Step 2, referring to FIG. 8, start to bond wires to electrically connect the substrate 10 with the three edges 111, 112, 113 of the image sensor chip 20 on which the adhesive are not deposited.

Figure 9:
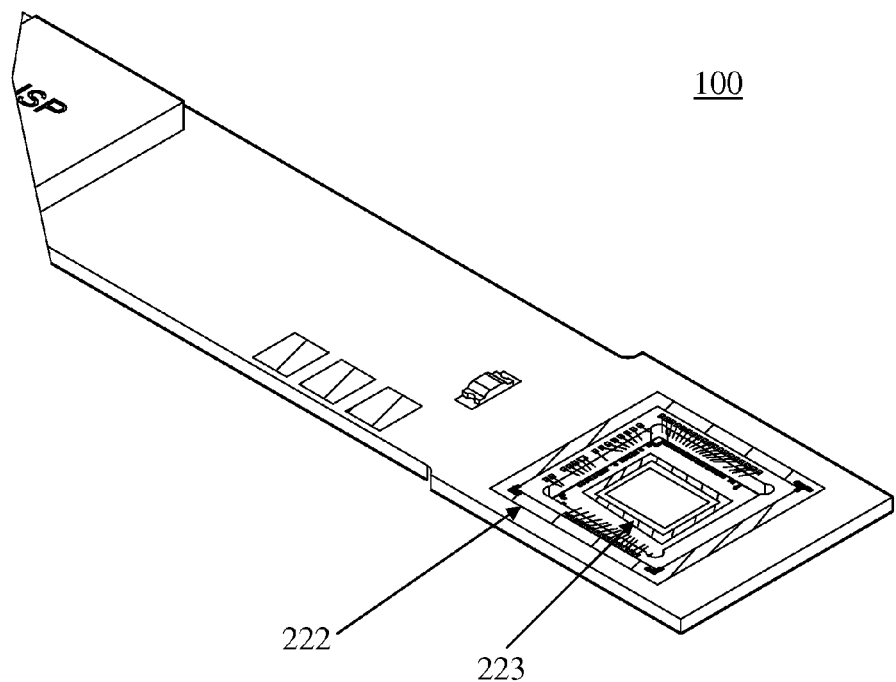
FIG. 9 is a third schematic view of the camera lens module manufacturing method of the embodiment of the present invention.

Step 3, referring to FIG. 9, apply a second adhesive deposit to deposit the adhesive on the periphery of the image sensor chip 20 without an optical function and on a predetermined periphery of the substrate 10 near the opening of the substrate 10, like the areas 223, 222 pointed by the two arrow head as shown in FIG. 9.

Figure 10:
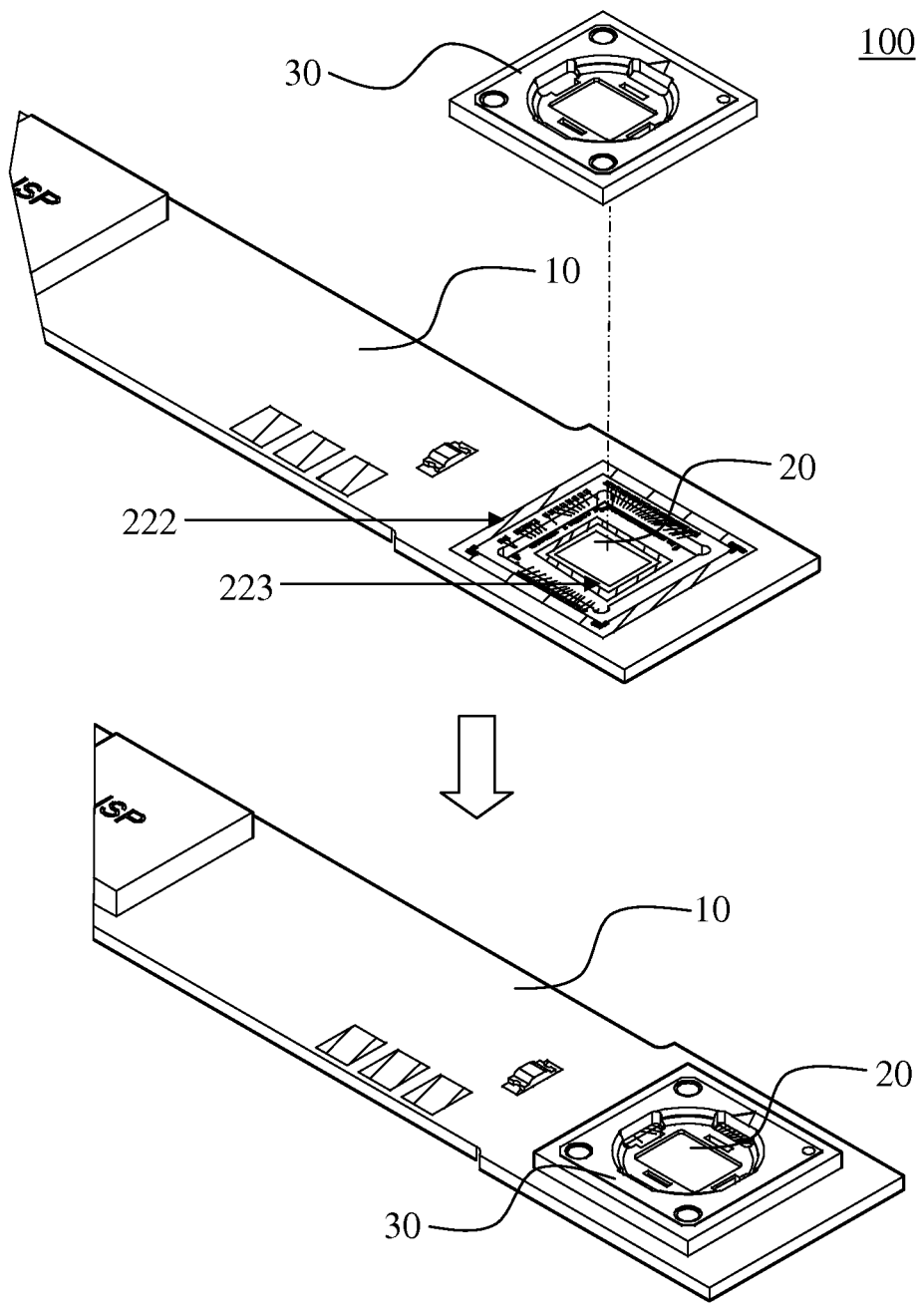
FIG. 10 is a fourth schematic view of the camera lens module manufacturing method of the embodiment of the present invention.

Step 4, referring to FIG. 10, locate the frame 30 so that the frame 30 corresponds to the corresponding areas where the second adhesive deposit is applied, that is, the areas with the adhesive 222 and the adhesive 223 as shown in FIG. 9. After the frame 30 is located corresponding to the corresponding position, fix the frame 30 on the substrate 10 and the image sensor chip 20 and then perform a second adhesive drying process.

Figure 11:
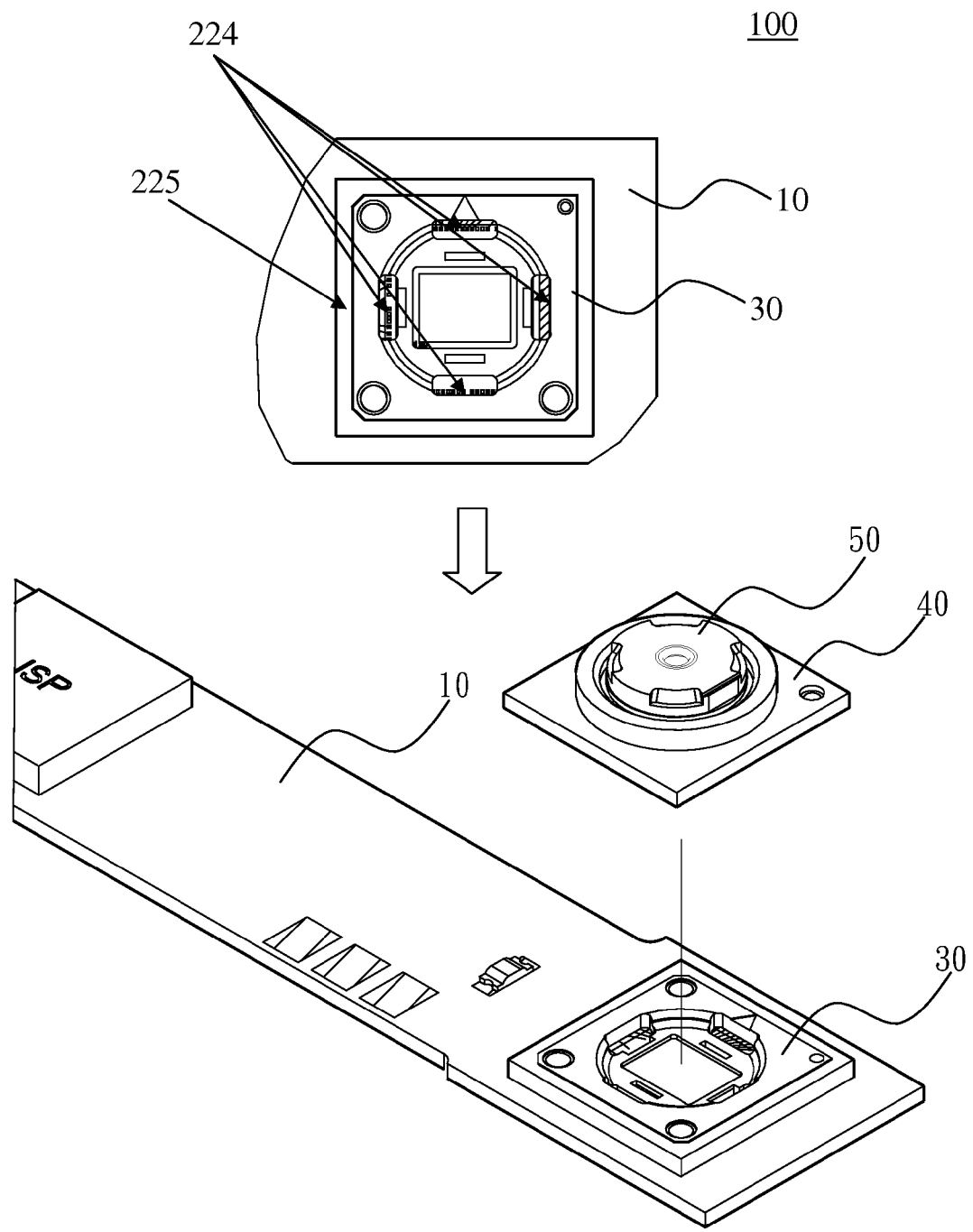
FIG. 11 is a fifth schematic view of the camera lens module manufacturing method of the embodiment of the present invention.

Step 5, referring to FIG. 11, apply a third adhesive deposit on four recesses of the frame 30, that is, deposit adhesive on the recesses 224 of the frame 30, as shown in FIG. 11, to fill the gaps between the substrate 10, the image sensor chip 20 and the frame 30 in order to improve the assembly strength, and then perform a third adhesive drying process. The step may be omitted according to the size and the strength of the substrate 10.

Step 6, referring to FIG. 11, apply a fourth adhesive deposit around the periphery of the frame 30, that is, deposit adhesive on the area 225 around the periphery of the frame 30 as shown in FIG. 11, and then assemble the lens holder 40 and the lens 50, that is, mount the lens 50 in the lens holder 40. Afterwards, fixing the lens holder 40 assembled with the lens 50 on the frame 30 corresponding to the area where the fourth adhesive deposit is applied, and perform a fourth adhesive drying process. Accordingly, all the steps of the camera lens module manufacturing method are completed.

Figure 12:
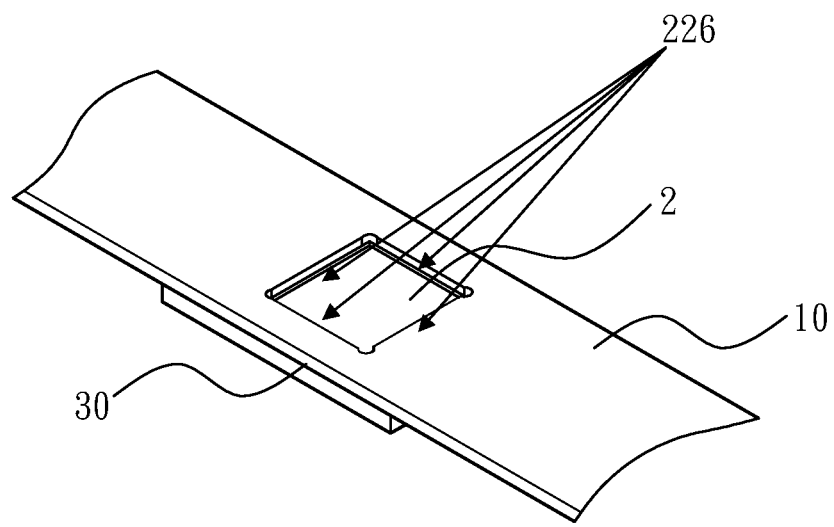
FIG. 12 is a sixth schematic view of the camera lens module manufacturing method of the embodiment of the present invention.

Especially, a working procedure may be added after the fourth step (i.e., before assembling the lens holder and the lens). Please referring to FIG. 12, take down the adhesive base 70 and apply an auxiliary adhesive deposit from the bottom surface of the substrate 10 in the gap between the opening and the image sensor chip 20, like the adhesive deposit area 226, as shown in FIG. 12, and then perform an auxiliary adhesive drying process.

Please referring to FIG. 6, finally attach a layer of opaque non-conductive material 60 of a thin film of black gum or a non-conductive black lacquer to the bottom surface of the substrate 10. The layer of opaque non-conductive material 60 may be omitted according to product quality.

The above described adhesive drying processes after all the adhesive deposit steps may be achieved by drying or UV irradiation.

Accordingly, comparing with conventional methods which directly fix sensor chips on substrates, the camera lens module 100 and the camera lens module manufacturing method thereof of the embodiments firstly place the image sensor chip 20 in the opening 11 of the substrate 10, and then use the frame 30 to fix the image sensor chip 20 and the substrate 10, so that the height of the substrate 10 totally has no effect on the total height of the module and the total height of the module is minimized, thereby the assembled product camera lens module 100 has the reduced total height. The assembled camera lens module 100 is fixed based on the adhesive and the frame 30, so the assembled camera lens module 100 has a firmer whole structure and unnecessary working procedures are omitted to ensure that the assembly method of the camera lens module 100 is simpler and more effective.

It is important to note that the camera lens module 100 of the embodiment can be applied in mobile phones, PDA and notebook computers which have optical camera lens modules, and digital cameras and so on, and the camera lens module manufacturing method can further be applied in manufacturing the camera lens modules used in the above products. The camera lens module and manufacturing method thereof is not limited in the above described products and manufacturing methods, and any product with a camera lens module can use the camera lens module 100 and the camera lens module manufacturing method related the embodiment.

What are disclosed above are only the specification and the drawings of the preferred embodiment of the present invention. It will be understood by those skilled in the art that various equivalent changes may be made depending on the specification and the drawings of the present invention without departing from the scope of the present invention.

What is claimed is:

1. A camera lens module, comprising:
a substrate (10), having a through-opening (11) defined thereon and a plurality of input conductive portions (12) disposed on the substrate proximate the through-opening;
an image sensor chip (20) having dimension no larger than that of the through-opening arranged in the through-opening and electrically connected to the input conductive portions on the substrate, the image sensor chip comprising a portion without optical function;
a frame (30) fixed on a top side of the substrate (10) around the through-opening with a portion of the frame extends into the through-opening of the substrate and coupled to the portion without optical function through selective application of adhesive,
wherein the frame (30) includes a plurality of recess structures (224) arranged horizontally in the boundary defined between the first adhesive portion (222) and the second adhesive portion (223) for exposing the image sensor chip there-through, wherein adhesive is disposable through the recess structures,
wherein the selective application of adhesive includes a first adhesive portion (222) surroundingly disposed on the top side of the substrate around the through-opening, and a second adhesive portion (223) enclosingly disposed on the portion without optical function in corresponding alignment with the extended portion of the frame, so as to retain the image sensor chip in the through-opening of the substrate;
a lens holder (40), fixed on the frame; and
a lens (50), assembled in the holder.

2. The camera lens module as claimed in claim 1, wherein the substrate is a printed circuit board.

3. The camera lens module as claimed in claim 1, further comprising a layer of opaque non-conductive material being applied to a bottom surface of the camera lens module.

4. The camera lens module as claimed in claim 3, wherein the layer of opaque non-conductive material is made of a non-conductive thin film of black gum adhered to the bottom surface of the camera lens module or non-conductive black lacquer coated on the bottom surface of the camera lens module.

5. The camera lens module of claim 1, wherein a side edge of the image sensor chip is adheringly attached to a portion of the inner side surface of the substrate (10) that defines the opening (11).

6. The camera lens module of claim 1, wherein adhesive is disposed through the recess structures to substantially fill gaps between the substrate (10), the image sensor chip (20), and the frame (30).

7. The camera lens module of claim 6, wherein the input conductive portion of the substrate and the image sensor chip are electrically connected through wire bonding (13), wherein the wire bonding is protected by encapsulating deposition of adhesive through the recess structures.

8. The Camera lens module of claim 7, wherein the wire bonding is protected by encapsulating deposition of adhesive from a bottom side of the substrate via the through-opening.

* * * * *